(12) United States Patent
Zhang et al.

(10) Patent No.: US 6,586,260 B2
(45) Date of Patent: Jul. 1, 2003

(54) SINGLE C-AXIS PGO THIN FILM ELECTRODES HAVING GOOD SURFACE SMOOTHNESS AND UNIFORMITY AND METHODS FOR MAKING THE SAME

(75) Inventors: Fengyan Zhang, Vancouver, WA (US); Jer-Shen Maa, Vancouver, WA (US); Wei-Wei Zhuang, Vancouver, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 55 days.

(21) Appl. No.: 09/820,078

(22) Filed: Mar. 28, 2001

(65) Prior Publication Data

US 2002/0142144 A1 Oct. 3, 2002

(51) Int. Cl.$^7$ .............. H01L 21/00; H01L 21/8234; H01L 21/8242
(52) U.S. Cl. ............ 438/3; 257/295; 438/238; 438/239; 438/240
(58) Field of Search .............. 438/3, 238, 239, 438/240, 381; 257/295, 300

(56) References Cited

U.S. PATENT DOCUMENTS

| | | | | |
|---|---|---|---|---|
| 4,027,074 A | * | 5/1977 | Cross et al. | 252/62.9 R |
| 5,030,331 A | * | 7/1991 | Sato | 204/192.15 |
| 5,225,364 A | * | 7/1993 | Nomoto et al. | 204/192.17 |
| 5,520,851 A | * | 5/1996 | Yu et al. | 106/1.28 |
| 5,618,390 A | * | 4/1997 | Yu et al. | 204/192.26 |
| 5,920,453 A | * | 7/1999 | Evans et al. | 361/303 |
| 6,052,271 A | * | 4/2000 | Nakamura | 257/295 |
| 6,146,906 A | * | 11/2000 | Inoue et al. | 204/192.18 |
| 2001/0013637 A1 | * | 8/2001 | Zhang et al. | 257/632 |

FOREIGN PATENT DOCUMENTS

EP    0743685 A2 * 11/1996 .......... H01L/29/78
EP    1056125 A2 * 11/2000 .......... H01L/21/316

OTHER PUBLICATIONS

Fengyan Zhang, Tingkai Li, Douglas J. Tweet and Sheng Teng Hsu, *Phase and microstructure analysis of lead germanate thin film deposited by metalorganic chemical vapor deposition*, Jpn. J. Appl. Phys. vol. 38, pp59–61 1999.

Fengyan Zhang, Jer–Shen Maa, Sheng Teng Hsu, Shigeo Ohnish and Wendong Zhen, *Studies of Ir–Ta–O as high temperature stable electrode Material and its application for ferroelectric SrBi$_2$Ta$_2$O$_9$ thin film deposition*, Jpn. J. Appl. Phys. vol. 38, pp 1447–1449, 1999.

Fengyan Zhang, Tingkai Li, Tue Nguyen, Sheng Teng Hsu, *MOCVD process of ferroelectric lead germanate thin films and bottom electrode effects*, Mat. Res. Soc. Symp. Proc. vol. 541, pp549–554, 1998.

* cited by examiner

Primary Examiner—Ngân V. Ngô
Assistant Examiner—Thao X. Le
(74) *Attorney, Agent, or Firm*—David C. Ripma; Matthew D. Rabdau; Scott C. Kriegar

(57) ABSTRACT

A method of forming an electrode and a ferroelectric thin film thereon, includes preparing a substrate; depositing an electrode on the substrate, wherein the electrode is formed of a material taken from the group of materials consisting of iridium and iridium composites; and forming a single-phase, c-axis PGO ferroelectric thin film thereon, wherein the ferroelectric thin film exhibits surface smoothness and uniform thickness. An integrated circuit includes a substrate; an electrode deposited on the substrate, wherein the electrode is formed of a material taken from the group of materials consisting of iridium and iridium composites, wherein the iridium composites are taken from the group of composites consisting of IrO$_2$, Ir—Ta—O, Ir—Ti—O, Ir—Nb—O, Ir—Al—O, Ir—Hf—O, Ir—V—O, Ir—Zr—O and Ir—O; and a single-phase, c-axis PGO ferroelectric thin film formed on the electrode, wherein the ferroelectric thin film exhibits surface smoothness and uniform thickness.

20 Claims, 2 Drawing Sheets

SINGLE C-AXIS PGO THIN FILM ELECTRODES HAVING GOOD SURFACE SMOOTHNESS AND UNIFORMITY AND METHODS FOR MAKING THE SAME

RELATED APPLICATION

This application is related to Ser. No. 09/817,712, filed Mar. 26, 2001, for Electrode materials with improved hydrogen degradation resistance and fabrication method, of Fengyan Zhang et at.

FIELD OF THE INVENTION

This invention relates FeRAM and DRAM integrated circuits, and specifically to structures that have Ir—Ta—O, Ir—Ti—O, Ir—Nb—O, Ir—Al—O, Ir—Hf—O, Ir—V—O or Ir—Zr—O as bottom electrodes and PGO thin film on top of these electrodes for applications.

BACKGROUND OF THE INVENTION

PGO thin film refers to $Pb_5Ge_3O_{11}$, ferroelectric phase. Although c-axis PGO usually exhibits layered microstructure, during the deposition process it is difficult to form single phase c-axis PGO thin film having a very smooth and uniform surface. One reason is that the PGO phase is polycrystalline. However, there are a few other lead germanium oxide compounds, which are very close to the $Pb_5Ge_3O_{11}$ phase, both in composition and formation temperature, and which are easier to form under similar conditions. If multiple phase lead germanate, having different microstructures, is formed on the surface of a bottom electrode at the same time, it is difficult to obtain a smooth and uniform c-axis PGO thin film. Several factors affect the formation of single-phase, c-axis PGO thin film, one of which is the surface condition of the bottom electrodes. The lattice constant matching is an important factor to form layered c-axis PGO thin film. The microstructure of PGO phase is hexagonal structure having lattice constants of a=10.251 Å and c=10.685 Å. For pure iridium (Ir) and platinum (Pt) metal bottom electrodes, which are face-centered-cubic (FCC) structures having lattice constants of a=3.83 Å and a–3.92 Å, respectively. Theoretically, it is relatively difficult to obtain the c-axis PGO single-phase on both electrodes. However, while this is true for a Pt substrate, c-axis PGO film may be formed relatively easily on an Ir substrate. This may be due to the thin layer of $IrO_2$ which forms on the Ir surface in situ during the deposition and annealing process, which may assist the c-axis PGO nucleation and grain growth. $IrO_2$ has lattice constants of a=4.498 Å, c=3.154 Å.

The orientation of the bottom electrode is also very important for the phase formation of the PGO thin film. It has been found that amorphous and polycrystalline substrates promote the formation of a smooth and uniform PGO thin film. A strong oriented substrate, having mismatched lattice constants tends to promote formation of polycrystalline ferroelectric PGO thin film having other secondary phases, wherein the film exhibits a rough surface.

FIG. 1 depicts a PGO thin film formed on a patterned substrate by MOCVD. The light area in FIG. 1a is a polished Pt substrate area, the darker areas are $SiO_2$ substrate. Both types of substrates are polished and planarized. FIG. 1bdepicts the crystalline structure of a PGO thin film formed on the Pt (left) and $SiO_2$ (right) substrate. It is clearly seen that the PGO thin film formed on the Pt substrate is polycrystalline and exhibits a rough surface. The PGO thin film formed on the $SiO_2$ substrate exhibits a layered single-phase structure. The PGO thin film formed on the $SiO_2$ substrate is single-phase c-axis PGO thin film.

The thermal stability of the electrode is also important in order to form a smooth and uniform single-phase c-axis PGO thin film. It has been found that both Pt and Ir tend to form hillocks during high temperature annealing, e.g., above 500° C., which affects the nucleation and orientation of PGO thin film. An Ir composite electrode, however, is very stable during even very high temperature annealing in oxygen ambient.

The existence of oxygen in the bottom oxide electrode also plays an important role. Because both the PGO and bottom electrode are metal oxide, the favored bonding condition between the oxides at the interface can increase nucleation density help in the formation of a smooth c-axis PGO thin film.

Fengyan Zhang, Tingkai Li, Douglas J. Tweet and Sheng Teng Hsu, *Phase and microstructure analysis of lead germanate thin film deposited by metalorganic chemical vapor deposition*, Jpn. J. Appl. Phys. Vol. 38, pp59–61 1999, discusses various phases of lead germanate as formed in thin films.

Fengyan Zhang, Jer-shen Maa, Sheng Teng Hsu, Shigeo Ohnish and Wendong Zhen, *Studies of Ir—Ta—O as high temperature stable electrode Material and its application for ferroelectric $SrBi_2Ta_2O_9$ thin film deposition,* Jpn. J. Appl. Phys. Vol. 38, pp1447–1449, 1999, describes the use of a Ta barrier layer and an Ir—Ta—O electrode.

Fengyan Zhang, Tingkai Li, Tue Nguyen, Sheng Teng Hsu, *MOCVD process of ferroelectric lead germanate thin films and bottom electrode effects,* Mat. Res. Soc. Symp. Proc. Vol. 541, pp549–554, 1998, describes growth of c-axis PGO thin film.

SUMMARY OF THE INVENTION

A method of forming an electrode and a ferroelectric thin film thereon, includes preparing a substrate; depositing an electrode on the substrate, wherein the electrode is formed of a material taken from the group of materials consisting of iridium and iridium composites; and forming a single-phase, c-axis PGO ferroelectric thin film thereon, wherein the ferroelectric thin film exhibits surface smoothness and uniform thickness. An integrated circuit includes a substrate; an electrode deposited on the substrate, wherein the electrode is formed of a material taken from the group of materials consisting of iridium and iridium composites, wherein the iridium composites are taken from the group of composites consisting of $IrO_2$, Ir—Ta—O, Ir—Ti—O, Ir—Nb—O, Ir—Al—O, Ir—Hf—O, Ir—V—O, Ir—Zr—O and Ir—O; and a single-phase, c-axis PGO ferroelectric thin film formed on the electrode, wherein the ferroelectric thin film exhibits surface smoothness and uniform thickness.

An object of this invention is to provide a uniform, single-phase, c-axis PGO thin film on a metal electrode.

Another object of the invention is to provide an iridium composite electrode, such as $IrO_2$, Ir—Ta—O, Ir—Ti—O, Ir—Nb—O, Ir—Al—O, Ir—Hf—O, Ir—V—O, Ir—Zr—O or Ir—O, as bottom electrode for FeRAM and DRAM applications.

Still another object of the invention is to provide a method of forming a PGO thin film on a metal electrode which may be used in integrated circuits, such as capacitors, pyroelectric infrared sensors, optical displays, optical switches, piezoelectric transducers, and surface acoustic wave devices.

A further object of the invention is to provide a method for depositing a PGO thin film by chemical solution deposition (CSD), sputtering, MOCVD or other thin film deposition methods, which will exhibit the smoothness and uniformity desired in the fabrication of an integrated circuit.

Yet another object of the invention is to provide an iridium composite electrode to improve the surface characteristics and lattice structure of a PGO thin film.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

The invention provides an iridium (Ir) composite electrode, formed of any of $IrO_2$, Ir—Ta—O, Ir—Ti—O, Ir—Nb—O, Ir—Al—O, Ir—Hf—O, Ir—V—O, Ir—Zr—O or Ir—O, as a bottom electrode for integrated circuit fabrication, such as FeRAM and DRAM applications and as capacitors, pyroelectric infrared sensors, optical displays, optical switches, piezoelectric transducers, and surface acoustic wave devices. The PGO thin film may be formed by any of chemical solution deposition (CSD), including spin-on deposition, or by sputtering, MOCVD or other thin film deposition methods. The Ir composite electrode improves the surface roughness and uniformity of thickness of the formed PGO thin film and may assist in the formation of a single-phase, c-axis PGO thin film.

The advantages of an Ir composite electrode for PGO thin film deposition have been demonstrated as follows: a) promote an increase the nucleation density; b) form a PGO thin film which exhibits a smooth and uniformly thick surface; c) form a pure c-axis PGO thin film; and d) provide a more stable substrate for deposition and annealing processes.

Figure 1:
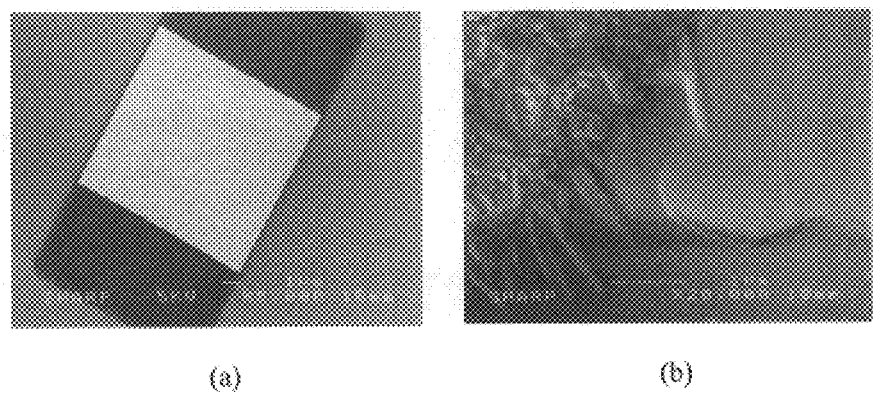
FIG. 1a is a SEM photo of the a substrate prior to deposition of a PGO thin film.
FIG. 1b is a SEM photo of the substrate of FIG. 1a with a PGO thin film formed thereon.
Figure 2:
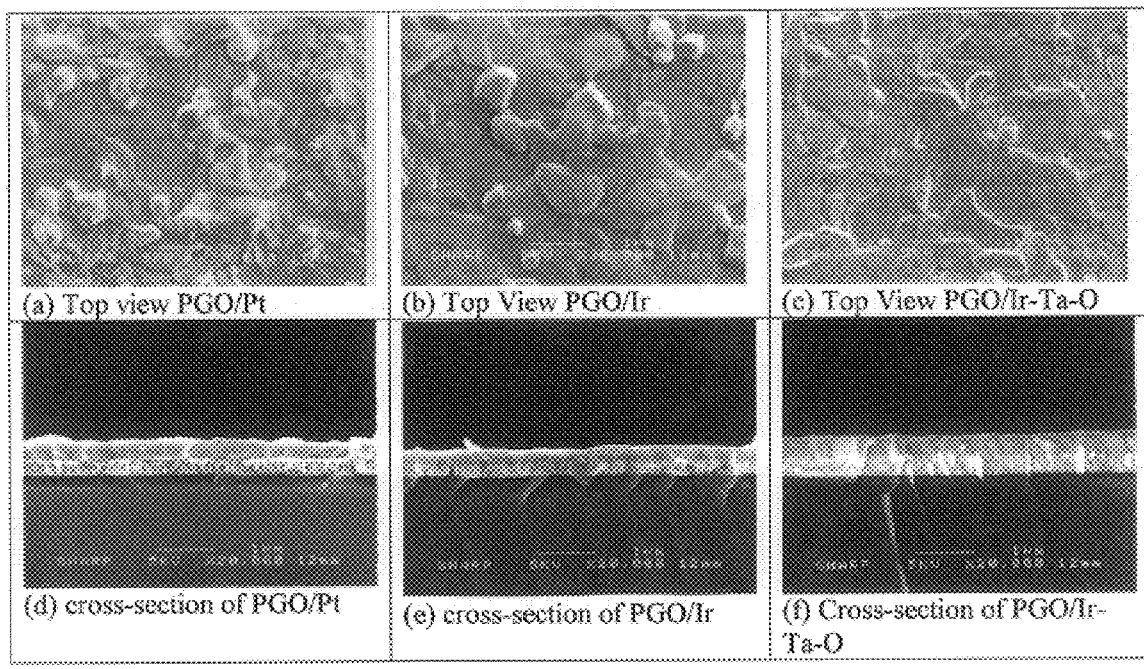
FIGS. 2a to 2f are SEM photos depicting surface morphology of PGO thin films formed on Pt, Ir, and Ir—Ta—O substrates, in top views and cross-sections.

Referring to FIG. 2, PGO thin film morphology as deposited on various substrates are depicted. As shown in FIGS. 2c and 2f, the smoothest surface is formed by the PGO deposited on the Ir—Ta—O substrate.

The processing conditions for the electrode include depositing an Ir—Ta—O electrode by reactive sputtering on a substrate, such as any of Si, $SiO_2$, SiGe, polysilicon, Ta, Ti, Nb, Al, Hf, V, Zr, and any of their nitrides or oxides, substrates. The carrier gas/reactive gas mixture of $Ar:O_2$ is 1:1, at a base pressure of about $5.10^{-7}$ Torr. The sputtering pressure is set at about 10 mTorr. Four-inch diameter Ir and Ta targets are sputtered at a power of about 300 W. The thickness of the resulting Ir—Ta—O electrode is in a range of between about about 1000 Å to 5000 Å.

To obtain similar surface conditions on a pure metal electrode as for the Ir composite electrode, an Ir electrode may be formed on a substrate, such as those identified above, and a very thin layer of metal or metal oxide deposited thereon. The metal or metal oxide has a thickness of between about 10 Å to 300 Å. The metal may be any of Ti, Ta, Zr, Hf, Nb, V; and the metal oxide may be any of $TiO_2$, $Ta_2O_5$, $ZrO_2$, $HfO_2$, $Nb_2O_5$, $VO_2$, $CeO_2$, $Al_2O_3$ and $SiO_2$. A post electrode annealing process in oxygen is necessary before the PGO thin film deposition. The preferred annealing conditions are in an oxygen atmosphere at between about 500° C. to 1000° C. for between about ten seconds to three hours.

Figure 3:
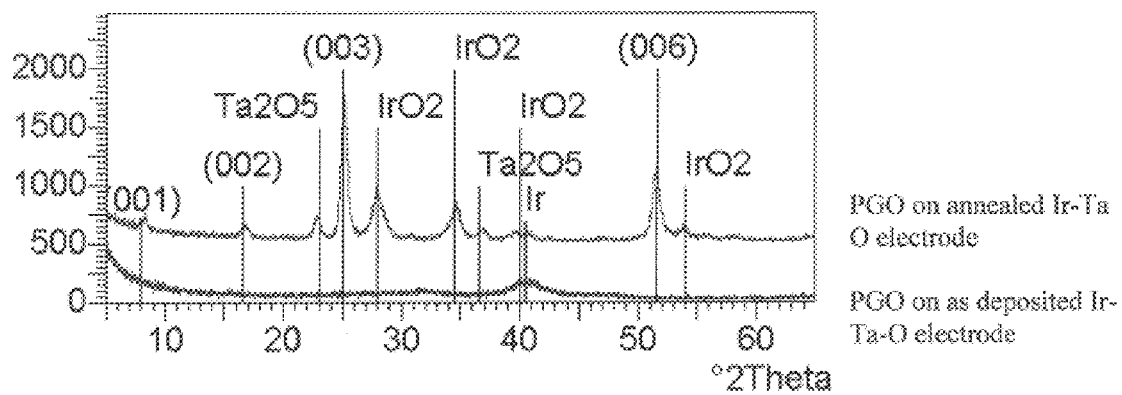
FIG. 3 depicts the XRD spectra of spin on PGO on as deposited on a Ir—Ta—O bottom electrodes and annealed at 800° C. in an oxygen atmosphere for ten minutes.

FIG. 3 is the XRD spectrum of a PGO thin film deposited by spin deposition on an Ir—Ta—O substrate and as deposited on an annealed Ir—Ta—O substrate. The annealing temperature for Ir—Ta—O electrode is about 800° C. for about 10 min. The precursor used is lead acetate trihydrate, $Pb(CH_3COO)_2 \cdot 3H_2O$ and germanium ethoxide, and $Ge(OC_2H_5)_4$ at a Pb/Ge molar ratio of 4–6:3, in which the water attached on $Pb(CH_3COO)_2 \cdot 3H_2O$ was removed by distillation. The film is baked at between about 100° C. to 300° C., and crystallization annealed in oxygen at 500° C. The PGO thin film deposited on the as-deposited Ir—Ta—O electrode is amorphous after a 500° C. 15 minute annealing process in an oxygen atmosphere. The PGO thin film deposited on the annealed Ir—Ta—O electrode exhibits strong c-axis PGO peaks after similar annealing. By comparing the XRD spectra peaks of the as-deposited and after-annealing Ir—Ta—O electrode, it is found that strong crystallized $IrO_2$ and $Ta_2O_5$ peaks are present in the annealed Ir—Ta—O electrode and that the pure Ir metal peak intensity has become lower. This means that the surface $IrO_2$ and $Ta_2O_5$ played an important role in the formation of a smooth c-axis PGO thin film.

Figure 4:
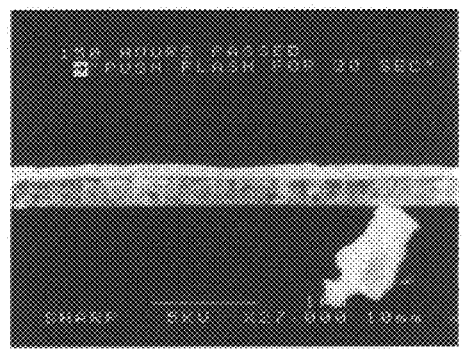
FIG. 4 is a SEM photo depicting the morphology of PGO thin film deposited on $IrO_2$ by MOCVD.

Similar microstructure is also observed for PGO thin film deposited by MOCVD on an $IrO_2$ substrate. The film surface of the PGO thin film is also very shinny, as shown in FIG. 4. The conditions for formation of the $IrO_2$ substrate is reactive sputtering in an $Ar/O_2$ atmosphere at a 1:1 ratio, and at a sputtering temperature of between about 200° C. to 300° C. The power on a four-inch Ir target is about 500 W. The base pressure is again about $5.10^7$ Torr. and the sputtering pressure is about 10 mTorr. The precursor used for MOCVD is $Pb(TMHD)_2$ and $Ge(ETO)_4$ at molar ratio at 5:3 and vaporizer temperature of between about 150° C. to 180° C. and substrate temperature of between about 450° C. to 550° C. The pressure in the chamber is 5 Torr. Flow rates for the Ar carrier gas and $O_2$ reaction gas are about 4000 sccm and 2000 sccm, respectively.

The Ir composite electrode needs to be annealed in oxygen ambient before PGO thin film deposition. The annealing temperature is between about 500° C. to 1000° C. and the annealing time is between ten seconds to three hours, depending on the thickness of the $IrO_2$ film. A PGO single-phase, c-axis thin film having good surface smoothness and uniformity may also be formed on an Ir substrate by depositing thin layer of metal or metal oxide, then annealing the structure in an oxygen atmosphere. The metal may be any of Ti, Ta, Zr, Hf, Nb, V; and the metal oxide may be any $TiO_2$, $Ta_2O_5$, $ZrO_2$, $HfO_2$, $Nb_2O_5$, $VO_2$, $CeO_2$, $Al_2O_3$ and $SiO_2$. Electrodes formed by the method of the invention can improve the surface roughness of a PGO thin film and can promote single c-axis PGO thin film formation.

Thus, an electrode having a single-phase c-axis PGO thin film exhibiting good surface smoothness and uniformity, and methods for making the same have been disclosed. It will be appreciated that further variations and modifications thereof may be made within the scope of the invention as defined in the appended claims.

We claim:

1. A method of forming an electrode and a ferroelectric thin film thereon, comprising:

preparing a substrate;

depositing an electrode on the substrate, wherein the electrode is formed of a material taken from the group of materials consisting of iridium and iridium composites; and forming a ferroelectric thin film thereon wherein the ferroelectric thin film exhibits surface smoothness and uniform thickness, including mixing a precursor of lead acetate trihydrate and germanium ethoxide in a Pb/Ge molar ratio of 4–6:3, distilling the mixture to remove the water; depositing a PGO thin film by chemical solution deposition; baking the structure at between about 100 EC to 300 EC; and crystallization annealing in an oxygen atmosphere at a temperature of about 500 EC.

2. The method of claim 1 wherein said depositing includes depositing an iridium composite electrode taken from the group of composites consisting of $IrO_2$, Ir—Ta—O, Ir—Ti—O, Ir—Nb—O, Ir—Al—O, Ir—Hf—O, Ir—V—O, Ir—Zr—O and Ir—O.

3. The method of claim 2 wherein said depositing includes depositing the electrode using a crier gas/reactive gas mixture of $Ar:O_2$ at a 1:1 ration, at a base pressure of about $5\cong10^{-7}$ Torr., wherein the sputtering pressure is set at about 10 mTorr., and wherein four-inch diameter Ir and Ta targets are sputtered at a power of about 300 W, and wherein the thickness of the resulting electrode is between about 1000Å and 5000Å.

4. The method of claim 1 wherein said depositing includes an iridium layer, and depositing a layer of material to a thickness of between about 10Å to 300Å, and wherein the material is taken from the group of material consisting of Ti, Ta, Zr, Hf, Nb, V, $TiO_2$, $Ta_2O_5$, $ZrO_2$, $HfO_2$, $Nb_2O_5$, $VO_2$, $CeO_2$, $Al_2O_3$ and $SiO_2$, and which further includes annealing the structure in an oxygen atmosphere before said forming.

5. The method of claim 4 wherein said annealing includes annealing the structure at a temperature of between about 500 EC to 1000 EC for a period of between about ten seconds and is three hours.

6. A The method of claim 1 wherein said depositing includes depositing an $IrO_2$ electrode by reactive sputtering in an $Ar:O_2$ atmosphere at a 1:1 ratio, and at a sputtering temperature of between about 200 EC to 300 EC, with the power on a four-inch ft target of about 500W, and a base pressure of about $5\cong10^{-7}$ Torr. and a sputtering pressure of about 10 mTorr.

7. The method of claim 6 wherein said forming includes depositing a PGO thin film by MOCVD using a precursor of $Pb(TMHD)_2$ and $Ge(ETO)_4$ at molar ratio at 5:3 and vaporizer temperature of between about 150 EC to 180 EC; a substrate temperature of between about 450 EC to 550 EC; a chamber pressure of about 5 Torr.; and a flow rates for an Ar carrier gas of about 4000 sccm and for an $O_2$ reaction gas of about 2000 sccm.

8. A method of forming an electrode and a ferroelectric thin film thereon, comprising:

preparing a substrate;

depositing an electrode on the substrate, wherein the electrode is formed of a material taken from the group of materials consisting of iridium and iridium composites, wherein the iridium composites are taken from the group of composites consisting of $IrO_2$, Ir—Ta—O, Ir—Ti—O, Ir—Nb—O, Ir—Al—O, Ir—Hf—O, Ir—V—O, Ir—Zr—O and Ir—O; and forming a PGO ferroelectric thin film thereon wherein the ferroelectric thin film exhibits surface smoothness and uniform thickness, including mixing a precursor of lead acetate trihydrate and germanium ethoxide in a Pb/Ge molar ratio of 4–6:3 distilling the mixture to remove the water; baking the structure at between about 100 EC to 300 EC; and crystallization annealing in an oxygen atmosphere at a temperature of about 500 EC.

9. The method of claim 8 wherein said depositing includes depositing the electrode using a carrier gas/reactive gas mixture of $Ar:O_2$ at a 1:1 radon, at a base pressure of about $5\cong10^{-7}$ Torr., wherein the sputtering pressure is set at about 10 mTorr., and wherein four-inch diameter Ir and Ta targets are sputtered at a power of about 300 W, and wherein the thickness of the resulting electrode is between about 1000Å and 5000Å.

10. The method of claim 8 wherein said depositing includes an iridium layer, and depositing a layer of material to a thickness of between about 10Å to 300Å, and wherein the material is taken from the group of material consisting of Ti, Ta, Zr, Hf, Nb, V, $TiO_2$, $Ta_2O_5$, $ZrO_2$, $HfO_2$, $Nb_2O_5$, $VO_2$, $CeO_2$, $Al_2O_3$ and $SiO_2$, and which further includes annealing the structure in an oxygen atmosphere before said forming.

11. The method of claim 10 wherein said annealing includes annealing the structure at a temperature of between about 500 EC to 1000 EC for a period of between about ton seconds and three hours.

12. The method of claim 8 wherein said depositing includes depositing an $IrO_2$ electrode by reactive sputtering in an $Ar:O_2$ atmosphere at a 1:1 ratio, and at a sputtering temperature of between about 200 EC to 300 EC, with the power on a four-inch Ir target of about 500W, and a base pressure of about $5\cong10^{-7}$ Torr. and a sputtering pressure of about 10 mTorr.

13. The method of claim 12 wherein said forming includes depositing a PGO thin film by MOCVD using a precursor of $Pb(TMHD)_2$ and $Ge(ETO)_4$ at molar ratio at 4–6:3 and vaporizer temperature of between about 150 EC to 180 EC; a substrate temperature of between about 450 EC to 550 EC; a chamber pressure of about 5 Torr.; and a flaw rates for an Ar carrier gas of about 4000 sccm and for an $O_2$ reaction gas of about 2000 sccm.

14. A method of forming an electrode and a ferroelectric thin film thereon, comprising:

preparing a substrate;

depositing an electrode on the substrate, wherein the electrode is formed of a material taken from the group of materials consisting of iridium and iridium composites; and forming a ferroelectric thin film thereon wherein the ferroelectric thin film exhibits surface smoothness and uniform thickness, including using a ferroelectric precursor of $Pb(TMHD)_2$ and $Ge(ETO)_4$ at molar ratio at 5:3 and vaporizer temperature of between about 150 EC to 180 EC; a substrate temperature of between about 450 EC to 550 EC; a chamber pressure of about 5 Torr.; and a flow rates for an Ar carrier gas of about 4000 sccm and for an $O_2$ reaction gas of about 2000 sccm.

15. The method wherein said depositing includes depositing an iridium composite electrode taken from the group of composites consisting of $IrO_2$, Ir—Ta—O, Ir—Ti—O, Ir—Nb—O, Ir—Al—O, Ir—Hf—O, Ir—V—O, Ir—Zr—O and Ir—O.

16. The method of claim 15 wherein said depositing includes depositing the electrode using a carrier gas/reactive gas mixture of Ar:$O_2$ at a 1:1 ration, at a base pressure of about $5 \cong 10^{-7}$ Torr., wherein the sputtering pressure is set at about 10 mTorr., and wherein four-inch diameter Ir and Ta targets are sputtered at a power of about 300 W, and wherein the thickness of the resulting electrode is between about 1000Å and 5000Å.

17. The method of claim 14 said depositing includes an iridium layer, and depositing a layer of material to a thickness of between about 10Å to 300Å, and wherein the material is taken from the group of material consisting of Ti, Ta, Zr, Hf, Nb, V, $TiO_2$, $Ta_2O_5$, $ZrO_2$, $HfO_2$, $Nb_2O_5$, $VO_2$, $CeO_2$, $AlO_3$ and $SiO_2$, and which further includes annealing the structure in an oxygen atmosphere before said forming.

18. The meted of claim 17 wherein said annealing includes annealing the structure at a temperature of between about 500 EC to 1000 EC for a period of between about ten seconds and three hours.

19. The method of claim 14 wherein said fanning includes mixing a precursor of lead acetate trihydrate and germanium ethoxide in a Pb/Ge molar ratio of 4–6:3, distilling the mixture to remove the water; depositing a PGO thin film by chemical solution deposition; and baking the structure at between about 100 EC to 300 EC; and crystallization annealing in an oxygen atmosphere at a temperature of about 500 EC.

20. The method of claim 14 wherein said depositing includes depositing an $IrO_2$ electrode by reactive sputtering an Ar:$O_2$ atmosphere at a 1:1 ratio, and at a sputtering temperature of between about 200 EC to 300 EC, with the power on a four-inch IR target of about 500W, and a base of pressure of about $5 \cong 10^{-7}$ Torr. and a sputtering pressure of about mTorr.

* * * * *